(12) United States Patent
Weng et al.

(10) Patent No.: US 10,707,152 B2
(45) Date of Patent: Jul. 7, 2020

(54) HIGH-FREQUENCY DEVICE AND MANUFACTURING METHOD THEREOF

(71) Applicant: InnoLux Corporation, Miao-Li County (TW)

(72) Inventors: Ming-Yen Weng, Miao-Li County (TW); Ker-Yih Kao, Miao-Li County (TW); Chia-Chi Ho, Miao-Li County (TW); Tsutomu Shinozaki, Miao-Li County (TW); Cheng-Chi Wang, Miao-Li County (TW); I-Yin Li, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/844,907

(22) Filed: Dec. 18, 2017

(65) Prior Publication Data

US 2018/0204785 A1    Jul. 19, 2018

Related U.S. Application Data

(60) Provisional application No. 62/446,581, filed on Jan. 16, 2017.

(30) Foreign Application Priority Data

Aug. 28, 2017    (CN) .......................... 2017 1 0749904

(51) Int. Cl.
*H01L 23/66* (2006.01)
*H01L 21/48* (2006.01)
(Continued)

(52) U.S. Cl.
CPC .......... *H01L 23/485* (2013.01); *H01L 21/311* (2013.01); *H01L 21/4814* (2013.01);
(Continued)

(58) Field of Classification Search
CPC . H01L 23/66; H01L 21/311; H01L 21/76813; H01Q 1/38
(Continued)

(56) References Cited

U.S. PATENT DOCUMENTS 7,001,841 B2    2/2006  Hirao et al.
8,976,076 B2    3/2015  Yoshida et al.
(Continued)

FOREIGN PATENT DOCUMENTS

CN    1489188 A      4/2004
CN    103369825 A   10/2013

OTHER PUBLICATIONS

Chinese language office action dated Dec. 2, 2019, issued in application No. CN 201710749904.8.

*Primary Examiner* — Didarul A Mazumder
(74) *Attorney, Agent, or Firm* — McClure, Qualey & Rodack, LLP

(57) ABSTRACT

A high-frequency device manufacturing method is provided. The method includes providing a substrate; forming a conductive material on the substrate; standing the substrate and the conductive material for a first time duration; forming a conductive layer by sequentially repeating the steps of forming the conductive material and standing at least once; and patterning the conductive layer. The thickness of the conductive layer is in a range from 0.9 μm to 10 μm. A high-frequency device is also provided.

4 Claims, 10 Drawing Sheets

(51) Int. Cl.
*H01L 23/485* (2006.01)
*H01L 21/311* (2006.01)
*H01L 25/065* (2006.01)
*H01Q 1/38* (2006.01)

(52) U.S. Cl.
CPC .......... *H01L 23/66* (2013.01); *H01L 25/0655* (2013.01); *H01Q 1/38* (2013.01)

(58) Field of Classification Search
USPC ......................................................... 257/664
See application file for complete search history.

(56) References Cited

U.S. PATENT DOCUMENTS

| | | | | |
|---|---|---|---|---|
| 2006/0141978 A1* | 6/2006 | Liu | ...................... | H03H 7/0115 455/333 |
| 2006/0141979 A1* | 6/2006 | Liu | ...................... | H01L 23/5227 455/333 |
| 2008/0160257 A1* | 7/2008 | Takada | ...................... | G02B 1/111 428/145 |
| 2011/0018657 A1* | 1/2011 | Cheng | ...................... | H01P 3/121 333/239 |
| 2011/0273356 A1* | 11/2011 | Kawaguchi | ......... | C23C 14/0015 343/873 |
| 2012/0229345 A1* | 9/2012 | Takaki | ................. | H01Q 1/2291 343/700 MS |
| 2013/0134528 A1* | 5/2013 | Nguyen | ................ | B81B 3/0021 257/415 |
| 2013/0257682 A1* | 10/2013 | Yoshida | .................... | H01P 3/08 343/905 |
| 2015/0027771 A1* | 1/2015 | Kagawa | ............... | H05K 9/0088 174/350 |
| 2015/0030824 A1* | 1/2015 | Crosley | ................ | H05K 1/0373 428/206 |
| 2015/0064429 A1* | 3/2015 | Iwaya | ...................... | B32B 7/12 428/213 |
| 2015/0372393 A1* | 12/2015 | Bower | ............... | H01Q 21/0093 29/601 |
| 2016/0049309 A1* | 2/2016 | Tapily | ............... | H01L 21/31116 438/703 |
| 2016/0049731 A1* | 2/2016 | Yamamoto | ........... | H01Q 1/2208 343/905 |
| 2016/0190052 A1* | 6/2016 | Ruben | ................. | H01L 21/4853 257/741 |
| 2016/0204494 A1* | 7/2016 | Pykari | ................... | H01P 11/001 333/1 |
| 2018/0068214 A1* | 3/2018 | Jesme | ............. | G06K 19/07754 |
| 2018/0255649 A1* | 9/2018 | Tay | ...................... | H05K 3/4007 |
| 2018/0255650 A1* | 9/2018 | Tay | ...................... | H05K 3/4682 |
| 2019/0058236 A1* | 2/2019 | Hussain | .................. | H01Q 9/42 |
| 2019/0241729 A1* | 8/2019 | Tanigawa | ................ | B32B 27/34 |

* cited by examiner

HIGH-FREQUENCY DEVICE AND MANUFACTURING METHOD THEREOF

CROSS REFERENCE TO RELATED APPLICATIONS

This application claims priority of U.S. Provisional Patent Application No. 62/446,581, filed on Jan. 16, 2017 and Chinese Patent Application No. 201710749904.8, filed on Aug. 28, 2017, the entirety of which is incorporated by reference herein.

BACKGROUND

Technical Field

The disclosure relates to an electronic device and a manufacturing method thereof.

The disclosure in particular relates to a conductive layer of the high-frequency device and a manufacturing method thereof.

Description of the Related Art

In the fabrication of conventional displays, when a conductive layer is deposited on a substrate by a deposition method such as physical vapor deposition (PVD), deposition to the thickness of thousands of angstroms (Å) is all that is generally required, and this is consistent with the needs of the product. However, for high-frequency devices (e.g., antennas), it is necessary to provide a thicker conductive layer on a substrate. However, for a substrate of conventional thickness, the plating of a conductive layer having a relatively thick thickness (for example, more than 1 μm) thereon will require a long-time for continuous deposition. The bumps of atoms during the deposition process release a great amount of heat energy, which accumulates in the conductive layer and the substrate. The conductive layer or the substrate may warp due to an increase in the stress of the structure. Therefore, a substrate plated with the conductive layer (e.g., metals) cannot be successfully conducted into the equipment for subsequent processing such as exposure, development, and the like. Thus, the difficulty of fabricating components that have a thick conductive layer are increased.

Accordingly, it is desirable to develop a structure of conductive layers, which can effectively maintain the flatness (warpage is greater than 0 mm/m and less than or equal to 1.5 mm/m, for example 0.5 mm/m), so as to reduce the above-mentioned problems of warpage caused by fabrication of thick conductive layers on the substrate.

SUMMARY

In accordance with some embodiments, the present disclosure provides a method for manufacturing a high-frequency device, including providing a substrate; forming a conductive material on the substrate; letting the substrate and the conductive material stand for a first time duration; forming a conductive layer by sequentially repeating the step of forming the conductive material and the step of letting stand at least once; and patterning the conductive layer. The thickness of the conductive layer is in a range from 0.9 μm to 10 μm.

In accordance with some embodiments, the present disclosure provides a method for manufacturing a high-frequency device, including providing a substrate; forming a conductive layer on the substrate; and patterning the conductive layer. The temperature of the substrate is in a range from 10° C. to 130° C.

In accordance with some embodiments, the present disclosure also provides a high-frequency device, including a substrate and a patterned conductive layer formed over the substrate. The patterned conductive layer has a thickness. The patterned conductive layer includes a first position and a second portion, the first position is located adjacent to the substrate, and the second position is located away from the substrate. The distance between the first position of the patterned conductive layer and the substrate is ⅕ times the thickness of the substrate. The distance between the second position of the patterned conductive layer and the substrate is ⅘ times the thickness of the substrate. The grain size at the first position is greater than the grain size at the second position.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
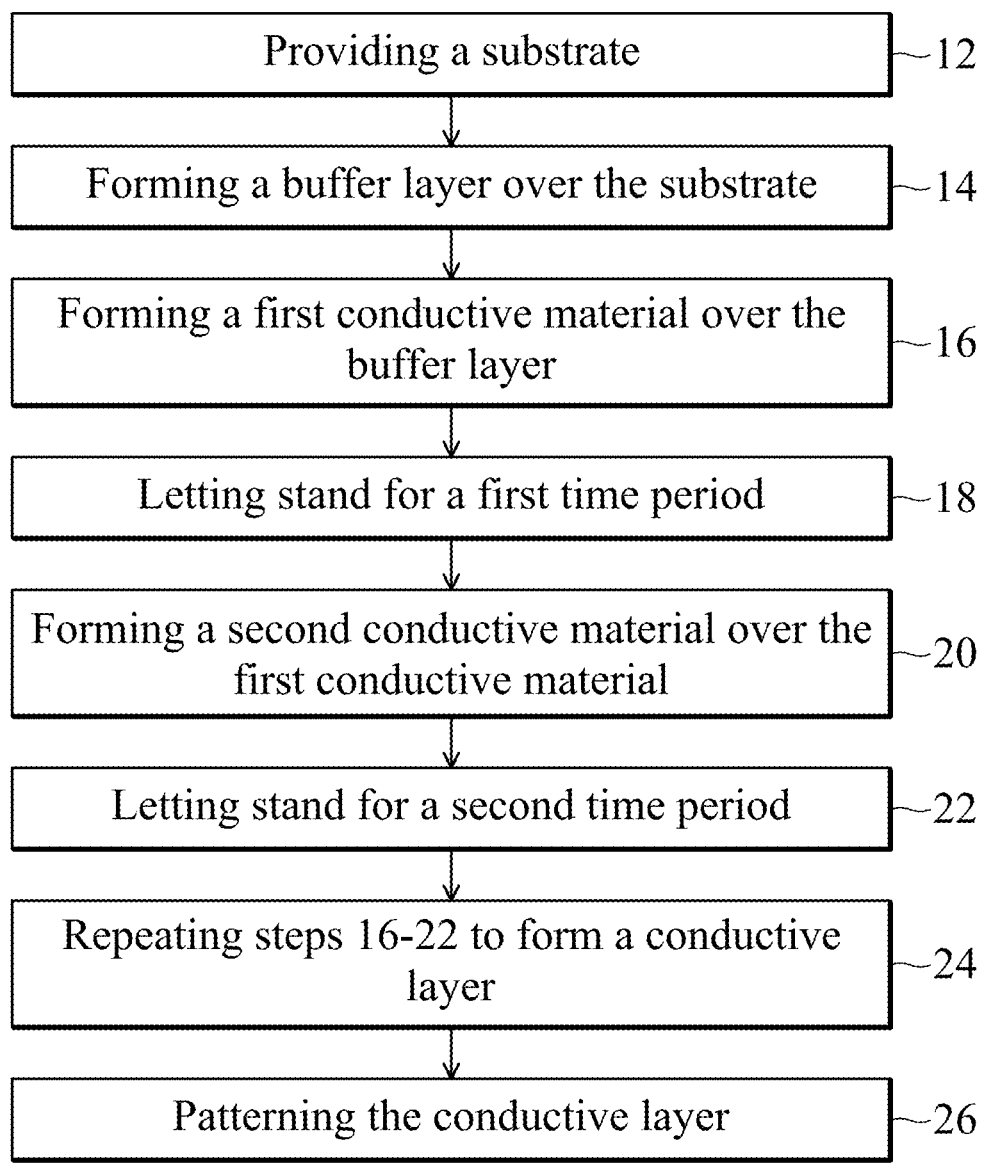
FIG. 1 illustrates a process flow of the method for manufacturing a high-frequency device in accordance with some embodiments of the present disclosure.

The high-frequency device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The method for manufacturing the high-frequency device provided in the present disclosure allows the conductive layer to have a greater thickness (e.g., greater than 1 μm). The warpage resulted from the high temperature of the conductive layer or the substrate may be decreased by controlling the temperature of the process for forming the conductive layer. Accordingly, the difficulty of subsequent processing may be reduced. In accordance with some embodiments of the present disclosure, the conductive layer that has a relatively great thickness is intermittently formed over the substrate during the manufacturing of the high-frequency device. The conductive layer is formed at a relatively low temperature, and thus the problem of warpage due to an increase in the stress of the conductive layer or the substrate may be reduced. In accordance with some embodiments of the present disclosure, the high-frequency device may include, but is not limited to, antennas of LCD, for example. The frequency of the high-frequency device in some embodiments of the present disclosure may be within a range from 1 GHz to 50 GHz. For example, the conductive layer of the high-frequency device in some embodiments of the present disclosure may serve as a waveguide or have a microwave signal transmission function, but it is not limited thereto.

FIG. 1 illustrates a process flow of a method 10 for manufacturing a high-frequency device in accordance with some embodiments of the present disclosure. It should be understood that additional operations may be provided before, during, and after processes in the method 10 for manufacturing a high-frequency device. In some embodiments of the present disclosure, some of the operations described below may be replaced or eliminated. The order of the operations/processes may be interchangeable. In some embodiments of the present disclosure, additional features may be added to the high-frequency device. In another embodiment of the present disclosure, some of the features described below may be replaced or eliminated. FIGS. 2A-2E illustrate the cross-sectional views of the high-frequency device in various stages of the method 10 in accordance with some embodiments of the present disclosure.

Figure 2A:
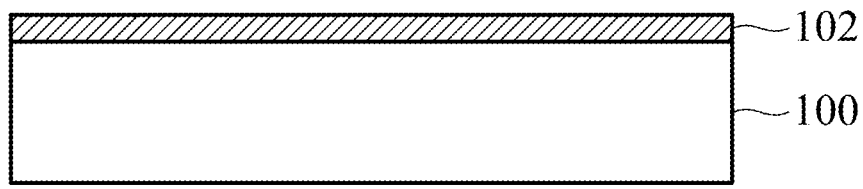
FIGS. 2A-2E illustrate the cross-sectional views of the high-frequency device in various stages for manufacturing the high-frequency device in accordance with some embodiments of the present disclosure.

First, referring to FIG. 1 and FIG. 2A, the method 10 for manufacturing the high-frequency device starts from step 12. In step 12, a substrate 100 is provided. The material of the substrate 100 may include, but is not limited to, glass, quartz, sapphire, polycarbonate (PC), polyimide (PI), polyethylene terephthalate (PET), any other suitable substrate material, or a combination thereof. In some embodiments of the present disclosure, the material of the substrate 100 may include glass. In some embodiments of the present disclosure, the thickness of the substrate 100 may be in a range from about 0.3 mm to about 1.1 mm.

In some embodiments of the present disclosure, the method 10 for manufacturing the high-frequency device may optionally include step 14. In step 14, a buffer layer 102 is formed over the substrate 100. The buffer layer 102 may be used to increase the adhesion between the substrate 100 and the conductive layer that are formed in the subsequent processes. The material of the buffer layer 102 may include, but is not limited to, molybdenum, molybdenum alloys, titanium, titanium alloys, aluminum, aluminum alloys, copper, copper alloys, indium tin oxide (ITO), indium zinc oxide (IZO), any other suitable buffer material, or a combination thereof. In some embodiments of the present disclosure, the material of the buffer layer 102 may include molybdenum. In some embodiments of the present disclosure, the thickness of the buffer layer 102 may be in a range from about 50 Å to about 500 Å. For example, the thickness of the buffer layer 102 may be 100 Å.

In addition, the buffer layer 102 may be formed by, but is not limited to, chemical vapor deposition (CVD), physical vapor deposition (PVD), electroplating process, electroless plating process, any other suitable processes, or a combination thereof. In some embodiments of the present disclosure, the buffer layer 102 may be formed by physical vapor deposition. The physical vapor deposition may include, but is not limited to, sputtering, evaporation, pulsed laser deposition (PLD) and so on. In some embodiments of the present disclosure, the buffer layer 102 may be formed by a sputtering process.

Figure 2B:
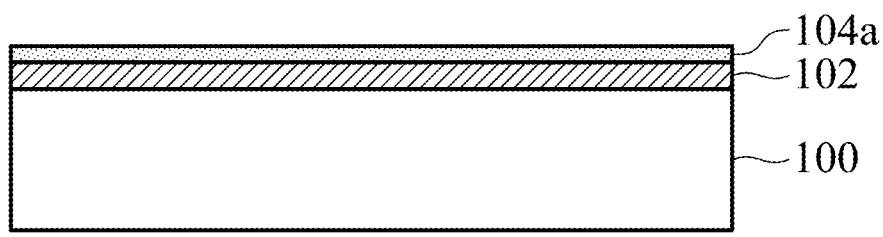

Next, referring to FIG. 1 and FIG. 2B, in step 16, a first conductive material 104a is formed over the buffer layer 102. The first conductive material 104a may include, but is not limited to, copper, aluminum, tungsten, titanium, gold, platinum, nickel, copper alloys, aluminum alloys, tungsten alloys, titanium alloys, gold alloys, platinum alloys, nickel alloys, any other suitable conductive materials, or a combination thereof. In some embodiments of the present disclosure, the first conductive material 104a may include copper. In some embodiments of the present disclosure, the thickness of the first conductive material 104a may be in a range from about 100 Å to about 1000 Å or from about 500 Å to 900 Å. For example, the thickness of the first conductive material 104a may be about 600 Å.

Moreover, the first conductive material 104a may be formed by, but is not limited to, chemical vapor deposition, physical vapor deposition, electroplating process, electroless plating process, any other suitable processes, or a combination thereof. In some embodiments of the present disclosure, the first conductive material 104a may be formed by physical vapor deposition. The physical vapor deposition may include, but is not limited to, sputtering, evaporation, pulsed laser deposition and so on. In some embodiments of the present disclosure, the first conductive material 104a may be formed by a sputtering process.

After the first conductive material 104a is formed, the substrate 100 and the first conductive material 104a formed thereon are let stand for a first time duration $t_1$, as shown in step 18. In particular, the substrate 100 may be placed in the process chamber before the buffer layer 102 is formed. For example, the substrate 100 may be placed in the process chamber for physical vapor deposition, and the subsequent step for forming the conductive layer may also be performed in same process chamber. In other words, after the first conductive material 104a is formed, the substrate 100 is not needed to be moved. Instead, the substrate 100 and the first conductive material 104a formed thereon are let stand in the same process chamber. In some embodiments of the present disclosure, the first time duration $t_1$ may be in a range from about 0.5 minutes to about 30 minutes or about 1 minute to about 10 minutes. For example, the first time duration $t_1$ may be 2 minutes. In other words, the first time duration $t_1$ may be greater than or equal to 0.5 minutes and less than or equal to 30 minutes (0.5 minutes≤the first time duration $t_1$≤30 minutes), or may be greater than or equal to 1 minute and less than or equal to 10 minutes (1 minute≤the first time duration $t_1$≤10 minutes).

Figure 2C:
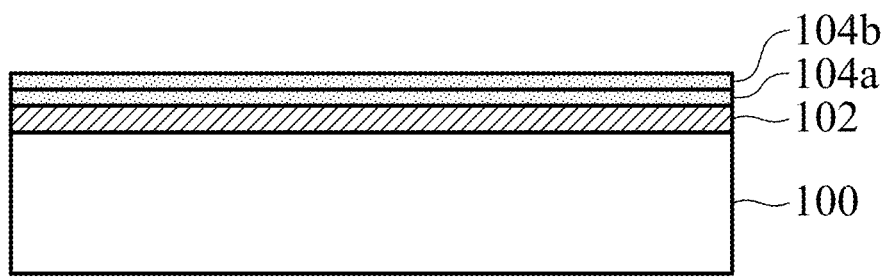

Next, referring to FIG. 1 and FIG. 2C, in step 20, the second conductive material 104b is formed over the first conductive material 104a. The structure and the manufacturing method of the second conductive material 104b are substantially similar to those of the first conductive material 104a. In particular, the second conductive material 104b may include, but is not limited to, copper, aluminum, tungsten, titanium, gold, platinum, nickel, copper alloys, aluminum alloys, tungsten alloys, titanium alloys, gold alloys, platinum alloys, nickel alloys, any other suitable conductive materials, or a combination thereof. In some embodiments of the present disclosure, the second conductive material 104b may include copper. In some embodiments of the present disclosure, the thickness of the second conductive material 104b may be in a range from about 100 Å to about 1000 Å or from about 500 Å to 900 Å. For example, the thickness of the second conductive material 104b may be about 600 Å. In some embodiments of the present disclosure, steps 16 and 18 may be respectively repeated at least once so as to form a conductive layer 104, but it is not limited thereto. The thickness T of the formed conductive layer 104 may be in a range from about 0.9 µm to about 10 µm or from about 1 µm to about 5 µm. In other words, the thickness T of the conductive layer 104 may be greater than or equal to 0.9 µm and less than or equal to 10 µm (0.9 µm≤thickness T≤10 µm), or may be greater than or equal to 1 µm and less than or equal to 5 µm (1 µm≤thickness T≤5 µm).

In addition, the second conductive material 104b may be formed by, but is not limited to, chemical vapor deposition, physical vapor deposition, electroplating process, electroless plating process, any other suitable processes, or a combination thereof. In some embodiments of the present disclosure, the second conductive material 104b may be formed by physical vapor deposition. The physical vapor deposition may include, but is not limited to, sputtering, evaporation, pulsed laser deposition and so on. In some embodiments of the present disclosure, the second conductive material 104b may be formed by a sputtering process.

Next, after the second conductive material 104b is formed, the substrate 100 and the second conductive material 104b formed thereon are let stand for a second time duration $t_2$, as shown in step 22. In some embodiments of the present disclosure, the second time duration $t_2$ may be in a range from about 0.5 minutes to about 30 minutes or about 1 minute to about 10 minutes. For example, the second time duration $t_2$ may be 2 minutes. In other words, the second time duration $t_2$ may be greater than or equal to 0.5 minutes and less than or equal to 30 minutes (0.5 minutes≤the second time duration $t_2$≤30 minutes), or may be greater than or equal to 1 minute and less than or equal to 10 minutes (1 minute≤the second time duration $t_2$≤10 minutes).

Figure 2D:
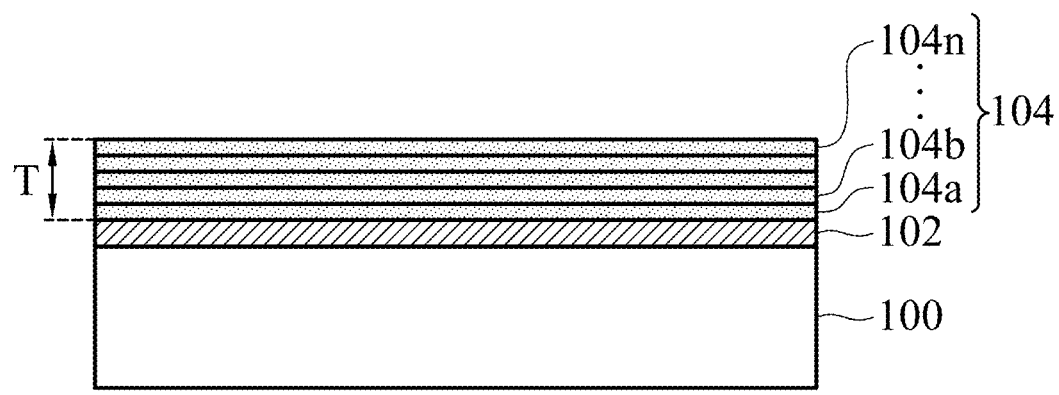

Next, referring to FIG. 1 and FIG. 2D, steps 16 to 22 are repeated at least once. In other words, the step of forming the conductive material and the step of letting the substrate 100 and the conductive material stand may be sequentially repeated at least once so as to form a conductive layer 104 (step 24). In some embodiments of the present disclosure, the conductive layer 104 may include the first conductive material 104a, the second conductive material 104b, to the Nth conductive material 104n. It should be understood that the structure and the manufacturing method of the conductive materials that are formed later (e.g., the Nth conductive material 104n) are also substantially similar to those of the first conductive material 104a and the second conductive material 104b, and thus will not be repeated herein. In some embodiments of the present disclosure, the thickness T of the formed conductive layer 104 may be in a range from about 0.9 µm to about 10 µm or from about 1 µm to about 5 µm. In other words, the thickness T of the conductive layer 104 may be greater than or equal to 0.9 μm and less than or equal to 10 μm, or may be greater than or equal to 1 μm and less than or equal to 5 μm.

In addition, the conductive materials such as the first conductive material 104a and the second conductive material 104b may have similar thickness or structure under the same or similar processing conditions as shown in the exemplary embodiments illustrated in the figures. However, it should be understood that the thickness, structure, or material of each conductive layer may be the same or different without departing from the teachings of the present disclosure. On the other hand, the standing time durations (e.g., the first time duration $t_1$ and the second time duration $t_2$) allow the temperatures of the substrate 100 and the conductive material to be moderately decreased, and thus are maintained at relatively low temperatures. For example, the temperature of the substrate 100 may be maintained at less than 130° C. or less than 120° C. during the formation of the conductive layer 104. In some embodiments of the present disclosure, the time durations of standing allows the temperature of the substrate 100 to be maintained at higher than or equal to 10° C. and less than or equal to 130° C. (10° C.≤the temperature of the substrate 100≤130° C.). In other words, the temperature of the substrate 100 may be maintained within a range from 10° C. to 130° C.

In particular, during the formation of the conductive layer 104 over the substrate 100 (e.g., the conductive layer 104 is formed by the deposition of sputtering process), thermal energy is released because the substrate 100 is continuously bumped by the particles. Accordingly, when thick conductive layer 104 is continuously deposited, heat will be accumulated in a great amount. A temperature that is too high (e.g., higher than 250° C.) increases the stress within the conductive layer 104 or the substrate 100, and thus results in warpage. However, when the conductive layer 104 is intermittently formed over the substrate 100 (i.e. the steps of forming the conductive material and letting stand are repeated at least once, or the conductive layer 104 is formed with time intervals), the substrate 100 may be maintained at a lower temperature (e.g., less than 130° C.). Thus, warpage resulting from the too high temperature may be reduced.

Figure 2E:
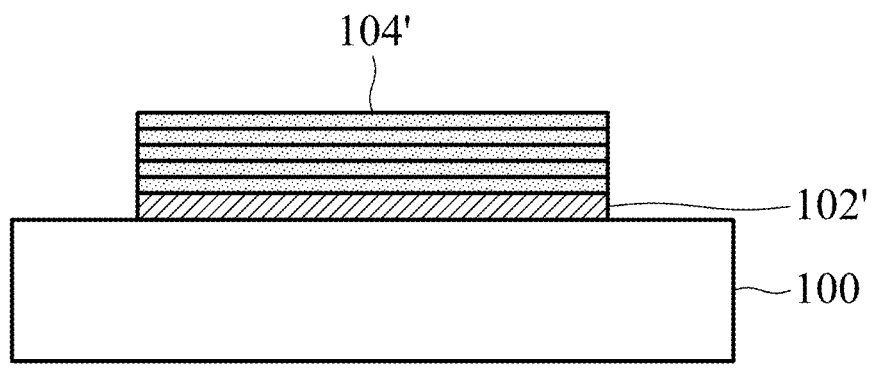

Next, referring to FIG. 1 and FIG. 2E, in step 26, the substrate 100 and the conductive layer 104 formed thereon are removed from the process chamber and a patterning process is conducted to form a patterned conductive layer 104'. In some embodiments of the present disclosure, as shown in FIG. 2E, during the formation of the patterned conductive layer 104', the buffer layer 102 is also partially removed to form a patterned buffer layer 102'.

The patterning process may include a photolithography process and an etching process. The photolithography process may include, but is not limited to, photoresist coating (e.g., spin-on coating), soft baking, hard baking, mask aligning, exposure, post-exposure baking, developing the photoresist, rinsing, drying, or other suitable processes. The etching process may include dry etching process or wet etching process. In particular, the process for patterning the conductive layer 104 may include a high-temperature process, e.g., the photolithography process or etching process in a temperature range from 130° C. to 360° C. In some embodiments of the present disclosure, the temperature of the substrate 100 in the step of patterning the conductive layer 104 (step 26) is greater than the temperature of the substrate 100 in the steps of forming the conductive layer (steps 16-20). As described above, since the conductive layer 104 is formed in a relatively low-temperature process, the grain size of the conductive layer 104 is smaller than that in a high-temperature process. However, after the above high-temperature process for patterning the conductive layer 104, the size of a part of the grains of the patterned conductive layer 104 will become larger. In other words, the high-temperature process for patterning the conductive layer 104 has an effect similar to annealing.

Figure 3:
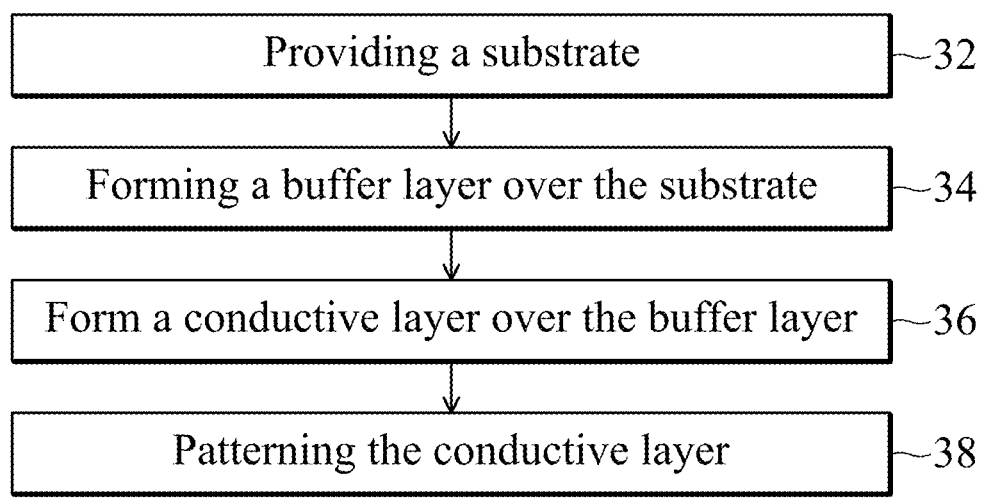
FIG. 3 illustrates a process flow of the method for manufacturing a high-frequency device in accordance with some embodiments of the present disclosure.
Figure 4A:
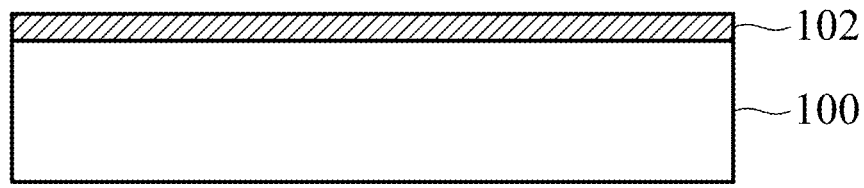
FIGS. 4A-4C illustrate the cross-sectional views of the high-frequency device in various stages for manufacturing the high-frequency device in accordance with some embodiments of the present disclosure.
Figure 4B:
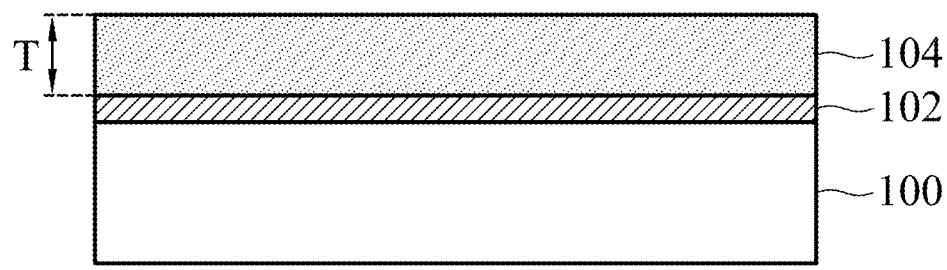
Figure 4C:
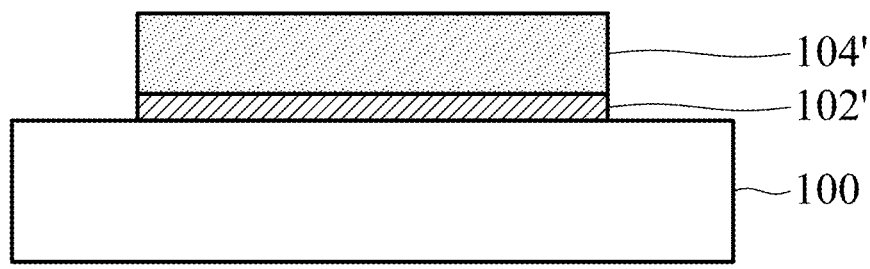
Figure 5A:
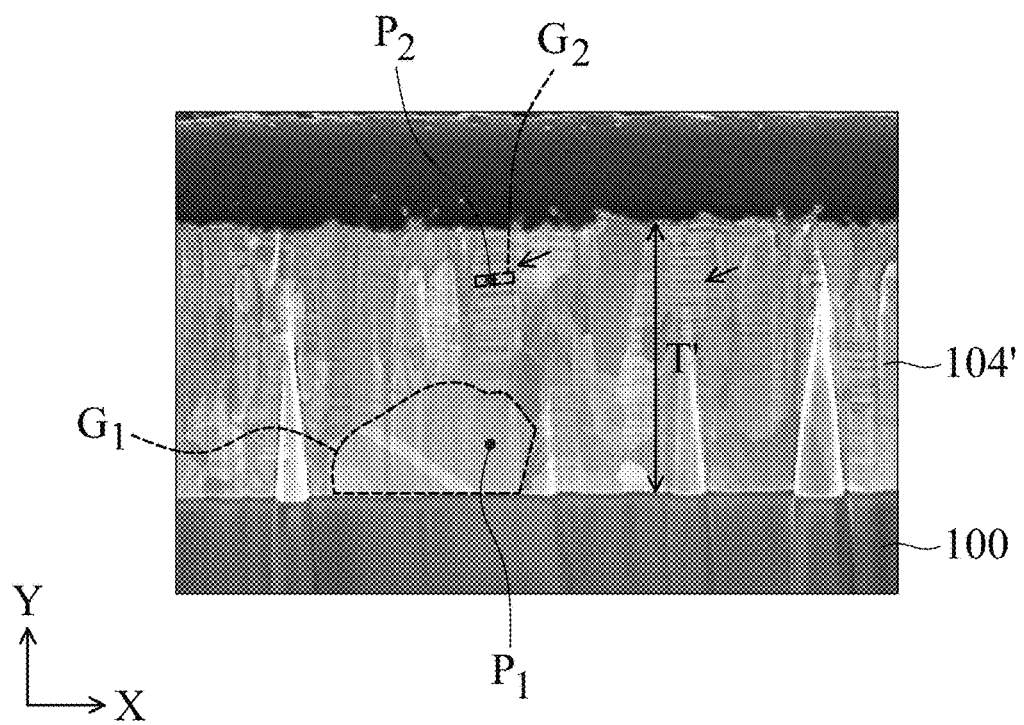
FIGS. 5A-5D illustrate the scanning electron microscope (SEM) diagrams of the patterned conductive layer of the high-frequency device in accordance with some embodiments of the present disclosure.
Figure 5B:
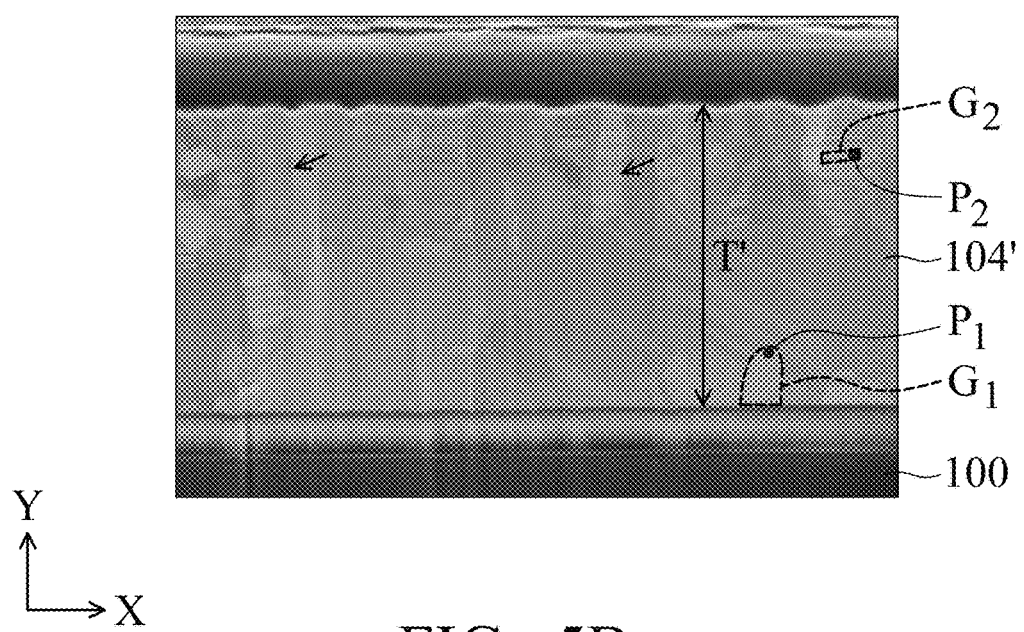
Figure 5C:
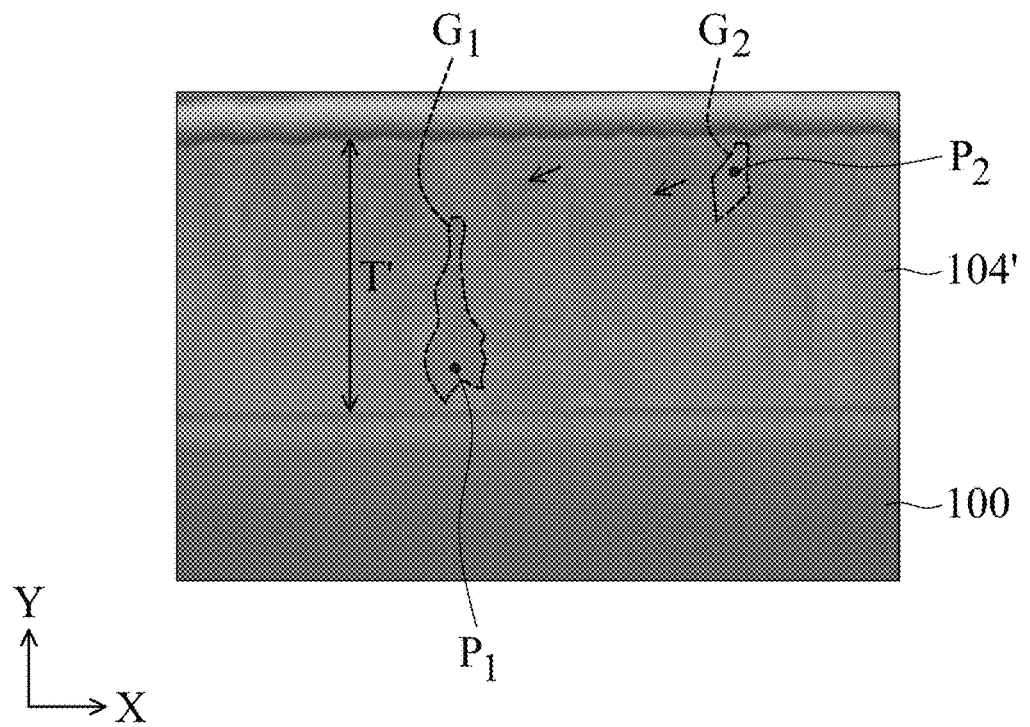
Figure 5D:
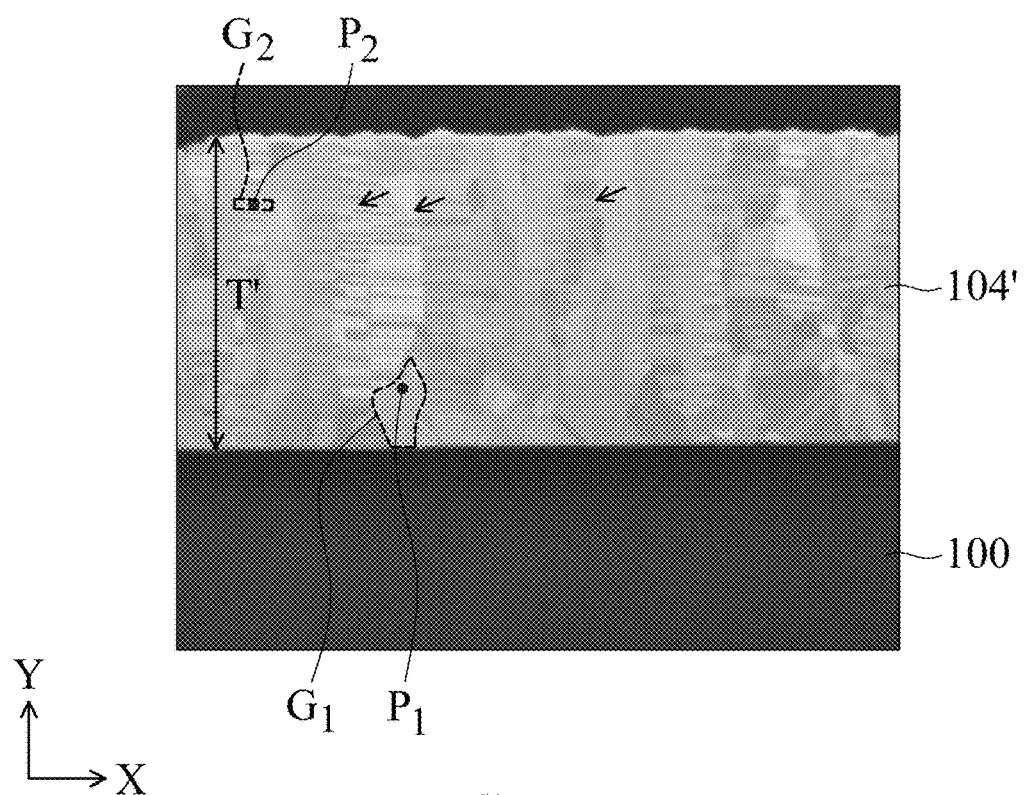

On the other hand, in accordance with some other embodiments of the present disclosure, in the method for manufacturing the high-frequency device, the relatively thick conductive layer may continuously be formed over the substrate and the temperature of the substrate is controlled by a cooling system. Thus, the warpage caused by an increase of the stress of the conductive layer or the substrate due to the high temperature may be reduced. FIG. 3 illustrates a process flow of the method 30 for manufacturing a high-frequency device in accordance with some embodiments of the present disclosure. FIGS. 4A-4C illustrate the cross-sectional views of the high-frequency device in various stages of the method 30 in accordance with some embodiments of the present disclosure.

First, referring to FIG. 3 and FIG. 4A, the method 30 for manufacturing the high-frequency device starts from step 32. In step 32, a substrate 100 is provided. The material of the substrate 100 may include, but is not limited to, glass, quartz, sapphire, polycarbonate, polyimide, polyethylene terephthalate, any other suitable substrate material, or a combination thereof. In some embodiments of the present disclosure, the material of the substrate 100 may include glass. In some embodiments of the present disclosure, the thickness of the substrate 100 may be in a range from about 0.3 mm to about 1.1 mm.

In some embodiments of the present disclosure, the method 30 for manufacturing the high-frequency device may optionally include step 34. In step 34, a buffer layer 102 is formed over the substrate 100. The buffer layer 102 may be used to increase the adhesion between the substrate 100 and the conductive layer that are formed in the subsequent processes. The material of the buffer layer 102 may include, but is not limited to, molybdenum, molybdenum alloys, titanium, titanium alloys, aluminum, aluminum alloys, copper, copper alloys, indium tin oxide (ITO), indium zinc oxide (IZO), any other suitable buffer material, or a combination thereof. In some embodiments of the present disclosure, the material of the buffer layer 102 may include molybdenum. In some embodiments of the present disclosure, the thickness of the buffer layer 102 may be in a range from about 50 Å to about 500 Å. For example, the thickness of the buffer layer 102 may be 100 Å.

In addition, the buffer layer 102 may be formed by, but is not limited to, chemical vapor deposition, physical vapor deposition, electroplating process, electroless plating process, any other suitable processes, or a combination thereof. In some embodiments of the present disclosure, the buffer layer 102 may be formed by physical vapor deposition. The physical vapor deposition may include, but is not limited to, sputtering, evaporation, pulsed laser deposition and so on. In some embodiments of the present disclosure, the buffer layer 102 may be formed by a sputtering process.

Next, referring to FIG. 3 and FIG. 4B, in step 36, a conductive layer 104 is formed over the buffer layer 102. It is noted that, during the formation of the conductive layer 104, the temperature of the substrate 100 may be greater than or equal to 10° C. and less than or equal to 130° C. In this embodiment, the conductive layer 104 is continuously formed over the buffer layer 102. In some embodiments of the present disclosure, the thickness T of the conductive layer 104 may be greater than or equal to 0.9 μm and less than or equal to 10 µm, or may be greater than or equal to 1 µm and less than or equal to 5 µm. The material of the conductive layer 104 may include, but is not limited to, copper, aluminum, tungsten, titanium, gold, platinum, nickel, copper alloys, aluminum alloys, tungsten alloys, titanium alloys, gold alloys, platinum alloys, nickel alloys, any other suitable conductive materials, or a combination thereof. In some embodiments of the present disclosure, the material of the conductive layer 104 may include copper.

In addition, the conductive layer 104 may be formed by, but is not limited to, chemical vapor deposition, physical vapor deposition, electroplating process, electroless plating process, any other suitable processes, or a combination thereof. In some embodiments of the present disclosure, the conductive layer 104 may be formed by physical vapor deposition. The physical vapor deposition may include, but is not limited to, sputtering, evaporation, pulsed laser deposition and so on. In some embodiments of the present disclosure, the conductive layer 104 may be formed by a sputtering process.

As described above, since the conductive layer 104 is continuously formed over the buffer layer 102, the temperature of the substrate 100 will be significantly increased. Therefore, in this embodiment, during the formation of the conductive layer 104, a cooling system is additionally disposed to control the temperature of the substrate 100 to be maintained in a relatively low temperature. In some embodiments of the present disclosure, during the formation of the conductive layer 104, the temperature of the substrate 100 may be maintained at less than 130° C. or less than 120° C. In some embodiments of the present disclosure, during the formation of the conductive layer 104, the temperature of the substrate 100 may be maintained in a range greater than or equal to less than 10° C. and less or equal to 130° C. by using the cooling system. In this way, the warpage caused by increase of the stress of the conductive layer 104 or the substrate 100 may be reduced. In addition, in some embodiments of the present disclosure, the temperature of the cooling system per se may be in a range from about −70° C. to about −190° C., or from about −80° C. to about −150° C.

Next, referring to FIG. 3 and FIG. 4C, in step 38, the substrate 100 and the conductive layer 104 formed thereon are removed from the process chamber and a patterning process is conducted to form a patterned conductive layer 104'. In some embodiments of the present disclosure, as shown in FIG. 4C, during the formation of the patterned conductive layer 104', the buffer layer 102 is also partially removed to form a patterned buffer layer 102'.

The patterning process may include a photolithography process and an etching process. The photolithography process may include, but is not limited to, photoresist coating (e.g., spin-on coating), soft baking, hard baking, mask aligning, exposure, post-exposure baking, developing the photoresist, rinsing, drying, or other suitable processes. The etching process may include dry etching process or wet etching process. In particular, the process for patterning the conductive layer 104 may include a high-temperature process, e.g., the photolithography process or etching process in a temperature range from 130° C. to 360° C. In some embodiments of the present disclosure, the temperature of the substrate 100 in the step of patterning the conductive layer 104 (step 38) is greater than the temperature of the substrate 100 in the steps of forming the conductive layer (step 36). As described above, since the conductive layer 104 is formed in a relatively low-temperature process, the grain size of the conductive layer 104 is smaller than that in a high-temperature process. However, after the above high-temperature process for patterning the conductive layer 104, the size of a part of the grains of the patterned conductive layer 104 will become larger. In other words, the high-temperature process for patterning the conductive layer 104 has an effect similar to annealing.

FIG. 2E and FIG. 4C respectively illustrate the diagrams of high-frequency devices formed by the method 10 for manufacturing the high-frequency device and the method 30 for manufacturing the high-frequency device. As shown in FIG. 2E and FIG. 4C, the high-frequency device 200 may include a substrate 100 and the patterned conductive layer 104' formed over the substrate 100. In some embodiments of the present disclosure, the high-frequency device 200 may further include a buffer layer 102, which is located between the substrate 100 and the patterned conductive layer 104'. There may be a patterned buffer layer 102' located between the substrate 100 and the patterned conductive layer 104'. The structure of the patterned conductive layer 104' is described in detail in the following description. In some embodiments of the present disclosure, the material of the patterned conductive layer 104' may include copper.

FIGS. 5A-5D illustrate the scanning electron microscope (SEM) diagrams of the patterned conductive layer 104' of the high-frequency device in accordance with some embodiments of the present disclosure. As shown in FIGS. 5A-5D, the patterned conductive layer 104' includes a first position P1 and a second position P2. The first position P1 is located adjacent to the substrate 100. The second position P2 is located away from the substrate 100. Moreover, the patterned conductive layer 104' has a thickness T'. The distance between the first position P1 and the substrate 100 is about ⅕ times the thickness T'. The distance between the second position P2 and the substrate 100 is about ⅘ times the thickness T'. In other words, the first position P1 is located at a position that is ⅕ the thickness T' distant from the substrate 100, and the second position P2 is located at a position that is ⅘ the thickness T' distant from the substrate 100. In some embodiments of the present disclosure, the grain size of grain G1 located at the first position P1 (as indicated by the dashed line) is larger than the grain size of grain G2 located at the second position P2 (as indicated by the dashed line). However, it should be understood that there may be a plurality of first positions P1 located at the positions that are ⅕ the thickness T' distant from the substrate 100, and there may be a plurality of second positions P2 located at the positions that are ⅘ the thickness T' distant from the substrate 100. The first position P1 and the second position P2 are not limited to the positions illustrated in the figures. In addition, the grain sizes of the patterned conductive layer 104' may be nonuniform. In some embodiments of the present disclosure, the grain boundaries at the first position P1 are less than the grain boundaries at the second position P2.

As described above, the grain size of at least one of the first position P1, which is closer to the substrate 100, is larger than the grain size of at least one of the second position P2, which is farther away from the substrate 100. The grain boundaries of at least one of the first position P1, which is closer to the substrate 100, are less than the grain boundaries of at least one of the second position P2, which is farther away from the substrate 100. It is presumed that the high-temperature process for patterning the conductive layer 104 has a greater influence on the temperature of the substrate 100. The temperature effect on the first position P1, which is closer to the substrate 100, is more obvious than that on the second position P2. Thus, the situations where the grain sizes become larger or the grain boundaries become less occur more often at the first position P1.

In addition, as shown in FIGS. 5A-5D, the patterned conductive layer 104' adjacent to the second position P2 further includes a plurality of stacked structures (as indicated by the arrow). In some embodiments of the present disclosure, the grains are stacked with each other and a stacked structure that is layered substantially along the Y direction (which is parallel to the direction of normal line of substrate) is formed. In some embodiments of the present disclosure, the grains are layered along a direction to form a stacked structure, and the angle between such a direction and the Y direction is from about 0.5 degrees to about 45 degrees, but it is not limited thereto. In some embodiments of the present disclosure, the thickness of each grain in the stacked structure may be different. In other embodiments of the present disclosure, the thickness of each grain in the stacked structure may be partially the same and partially different. In addition, in some embodiments of the present disclosure, the width of each grain in the same stacked structure may be different. In some embodiments of the present disclosure, the width of the grains may be different in the different stacked structures, but it is not limited thereto.

As described above, the grains adjacent to the second position P2 may be not arranged in order. Grains having other forms may be mixed in the stacked structure. For example, columnar grains or spherical grains may be mixed in the stacked structure, but it is not limited thereto. In fact, the mixture of grains having various sizes or forms may exist adjacent to both the first position P1 and the second position P2.

Examples 1-3: Intermittent Process

Copper is deposited over the glass substrate until the thickness of the copper layer reaches 3 μm using a PVD sputtering process through the intermittent deposition process (as shown in the method 10 for manufacturing the high-frequency device). After the deposition process, a patterning process is performed on the copper layer. The temperature of the substrate in the above sputtering process is in a range from 10° C. to 150° C. The sputtering continues for 4 to 13 seconds and then stops for 0.5 to 30 minutes, which is regarded as a cycle. The cycle is repeated 10 to 100 times. Afterwards, annealing at a temperature greater than 230° C. is conducted for more than 30 minutes.

Comparative Example—High-Temperature Continuous Process

Copper is deposited over the glass substrate until the thickness of the copper layer reaches 3 μm using a PVD sputtering process through the continuous deposition process. The temperature of the substrate in the above sputtering process is in a range from 200° C. to 300° C. The sputtering process is conducted for 150 to 500 seconds.

The Morphology Observation of the Conductive Layer

The conductive layers formed by the methods shown in the Examples are observed by using a scanning electron microscope. Diagrams of the conductive layers are shown in FIGS. 5A-5D. As described above, the grain sizes are larger and there are fewer grain boundaries in the conductive layer adjacent to the substrate. In comparison, the grain sizes are smaller and there are more grain boundaries in the conductive layer farther away from the substrate. In addition, the grains farther away from the substrate are stacked with each other to form a stacked structure. The stacked structure may extend substantially along the Y direction, which is parallel to the direction of normal line of the substrate. Alternatively, the stacked structure may extend in other directions. In general, grains of various sizes and forms exist nonuniformly in the conductive layer, and such a situation is even more obvious in the regions farther away from the substrate.

The Effect of the Patterning Process on the Conductive Layer

The effect of the patterning process on the resistivity of the conductive layer formed by the method in the Example is measured. In the particular method shown in the Example, the resistivity of the conductive layer before the patterning process is compared to that after the patterning process. For example, a NAPSON HA-6100/RG-1000F 4-point probe resistance machine may be used to take the measurement. The results show that the resistivity of the conductive layer before the patterning process is 2.37 μΩcm, and the resistivity of the conductive layer after the patterning process decreases to 2.07 μΩcm.

The Structural Observation of the Conductive Layer

Shimadzu XRD-6000 may be used to perform an X-ray diffraction analysis on the conductive layer. FIGS. 6A-6E are the X-ray diffraction diagrams of the copper layers formed by the methods used in the Comparative Example and Examples 1-3, respectively. In particular, the method shown in the Comparative Example corresponds to the traditional high-temperature (e.g., greater than 250° C.) continuous deposition process.

Figure 6A:
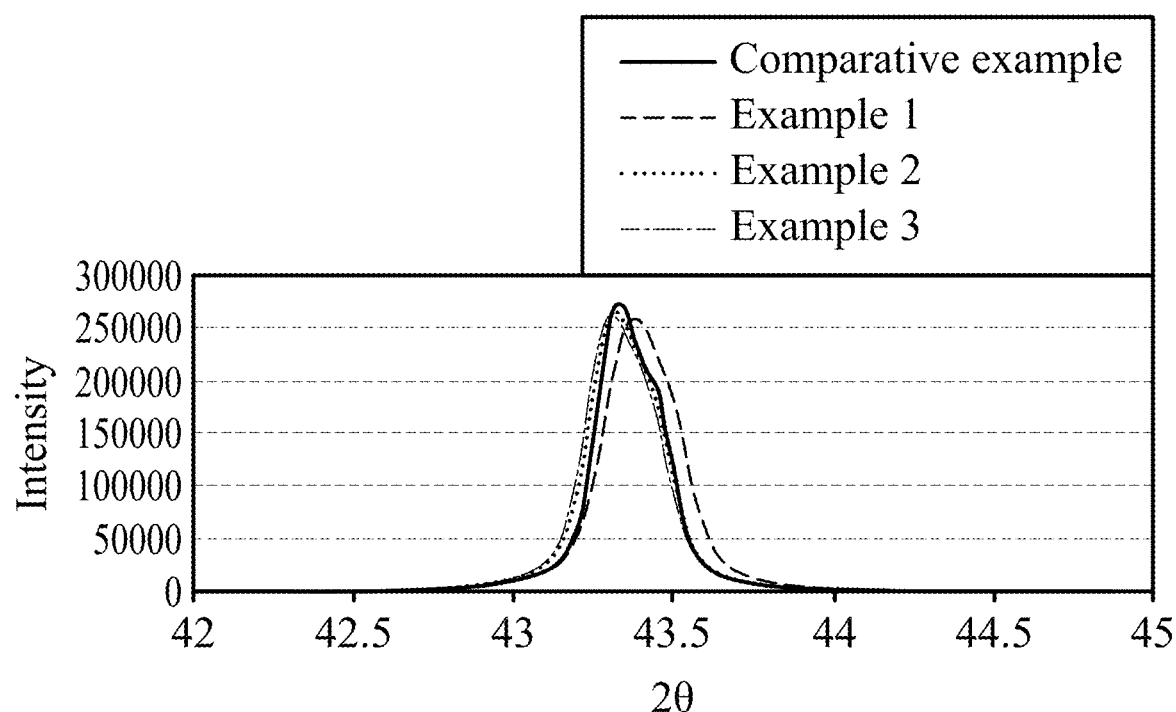
FIGS. 6A-6E are X-ray diffraction diagrams of the conductive layer of the high-frequency device in accordance with some embodiments of the present disclosure.
Figure 6B:
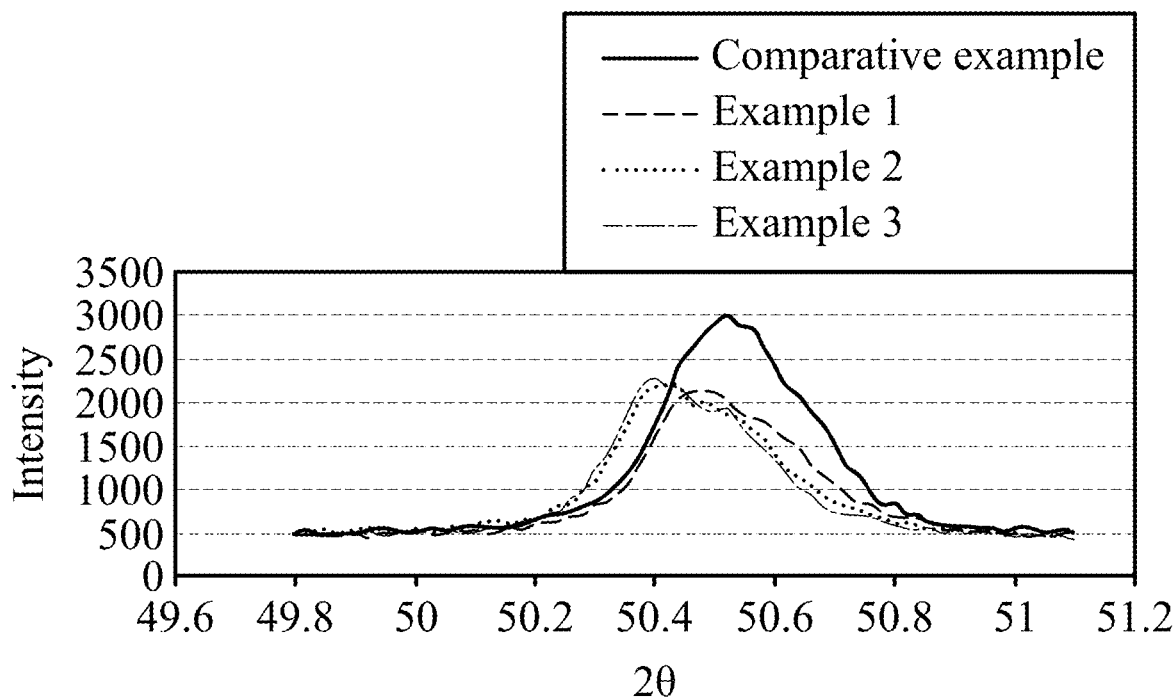
Figure 6C:
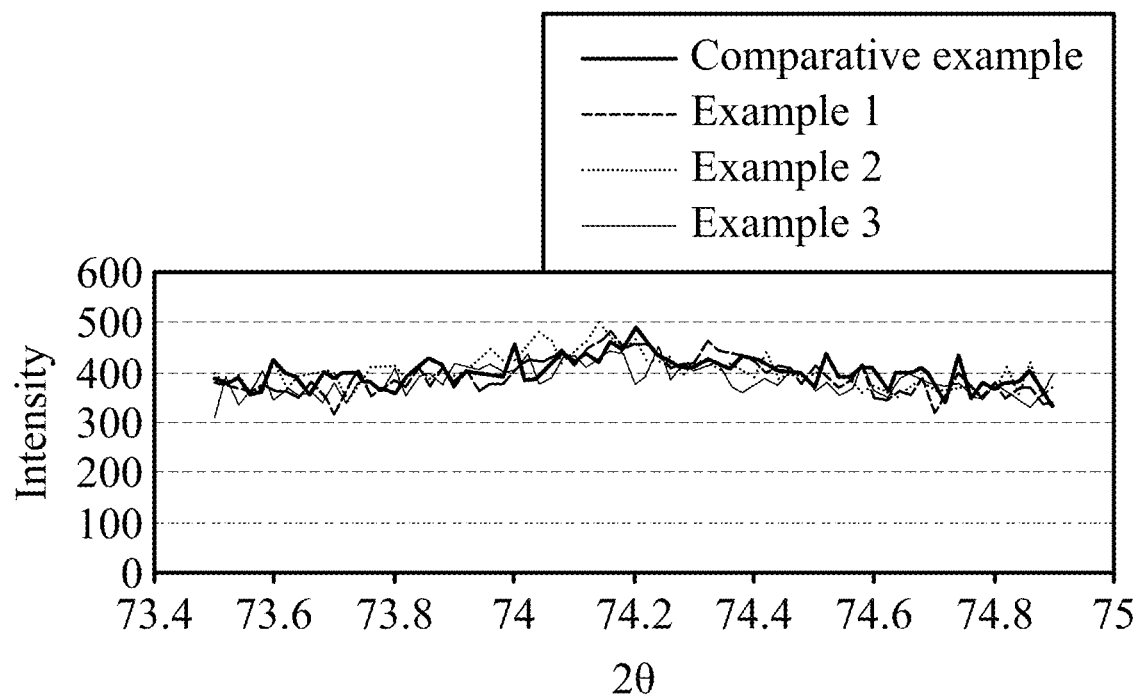
Figure 6D:
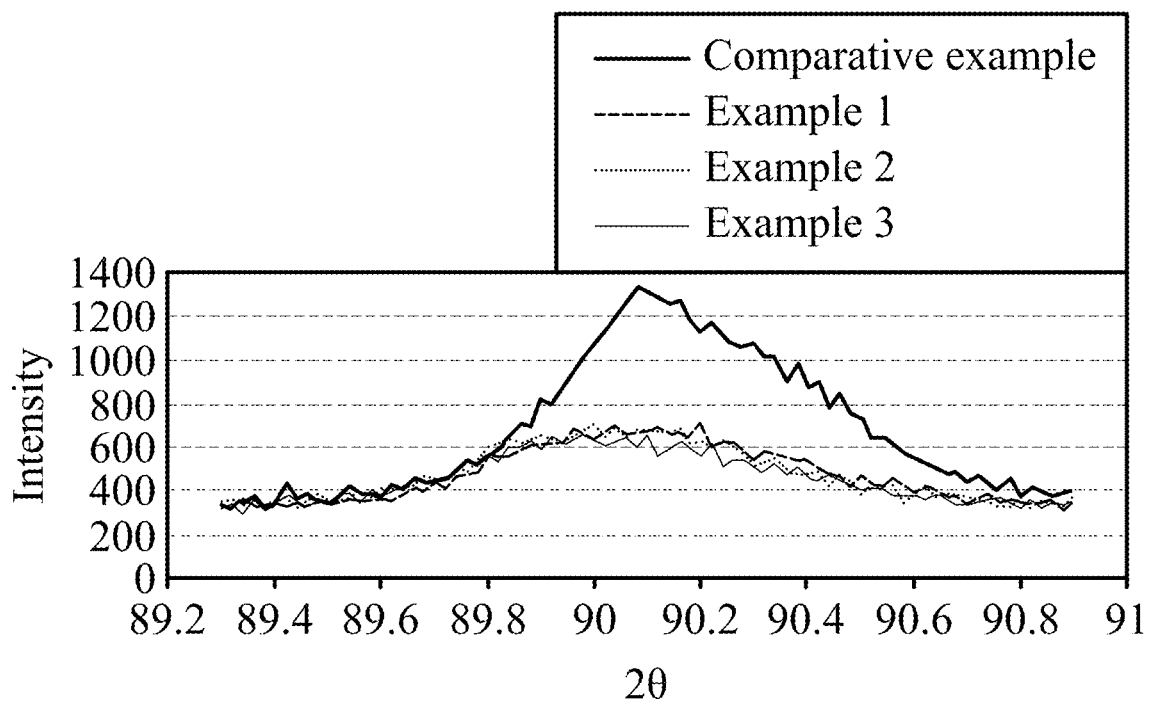
Figure 6E:
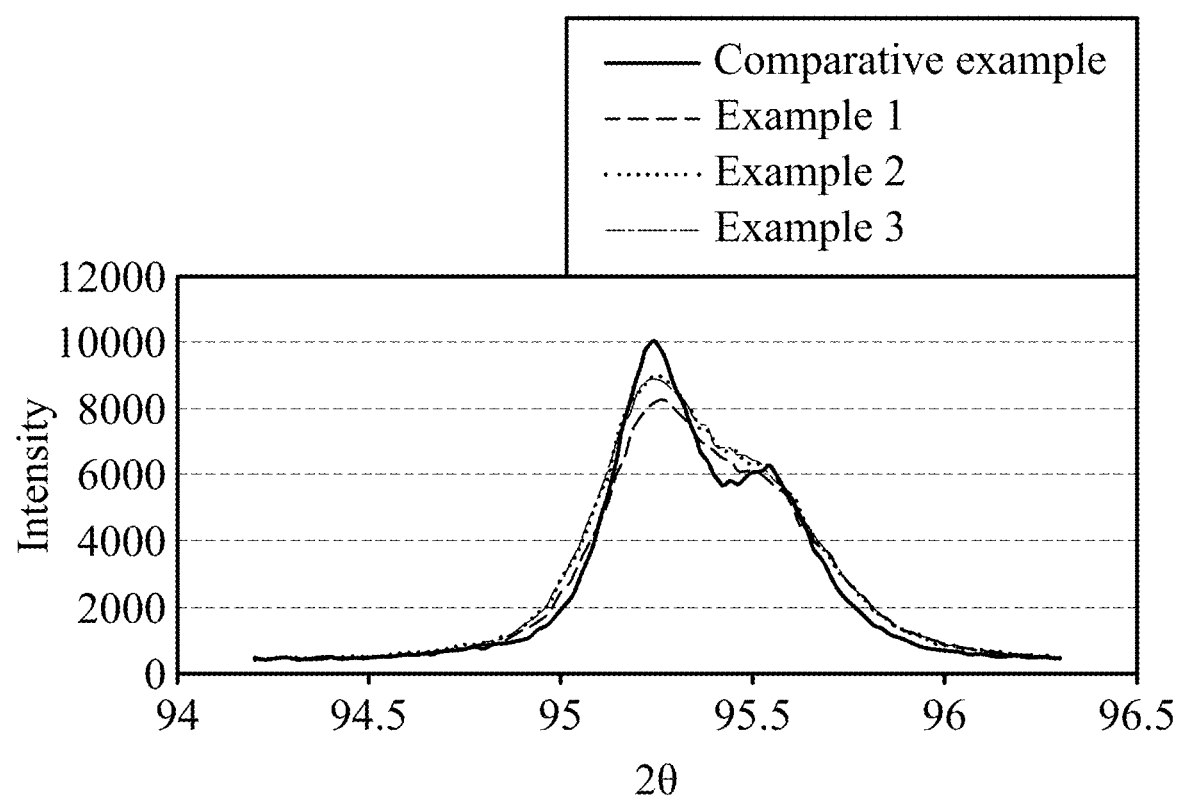

FIGS. 6A-6E are X-ray diffraction diagrams of the copper layers at crystal orientations (111), (200), (220), (311) and (222), respectively. Examples 1-3 represent the results measured at three different positions in the same sample. As shown in FIGS. 6A-6E, for the copper layers formed in Comparative Example and Example, the difference between the intensities at crystal orientation (111) (FIG. 6A) and crystal orientation (220) (FIG. 6C) is not big; and the intensity of Comparative Example is higher than that of Example at crystal orientation (200) (FIG. 6B), crystal orientation (311) (FIG. 6D) and crystal orientation (222) (FIG. 6E). In addition, the phenomenon of peak shifting is more obvious at crystal orientation (200) in the copper layers formed in Comparative Example and Example. According to the results described above, the copper layers formed in Comparative Example and Example have different crystallization conditions. For example, the proportions of the copper layers formed in Comparative Example and Example are different at different crystal orientations (2θ).

To summarize the above, the method for manufacturing the high-frequency device provided in the present disclosure may allow a relatively thick conductive layer (e.g., greater than 1 μm) to be formed in a relatively low-temperature process, as compared to the traditional high-temperature continuous coating process. The method for manufacturing the high-frequency device provided in the present disclosure may effectively reduce the stress in the substrate and thus may decrease the warpage that occurs as a result of the temperature of the conductive layer or the substrate being too high. Moreover, in the method for manufacturing the high-frequency device of the present disclosure, the resistivity or grain types of the conductive layer may be altered through the patterning process and thereby the properties of the conductive layer may be altered.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a high-frequency device, comprising:
    providing a substrate;
    forming a conductive material on the substrate;
    standing the substrate and the conductive material for a first time duration;
    forming a conductive layer by sequentially repeating the step of forming the conductive material and the step of standing at least once, wherein a thickness of the conductive layer is in a range from 0.9 μm to 10 μm; and
    patterning the conductive layer, wherein the conductive layer comprises copper;
    wherein the first time duration is in a range from 0.5 minutes to 30 minute.

2. The method for manufacturing a high-frequency device as claimed in claim 1, further comprising forming a buffer layer on the substrate before the step of forming the conductive material.

3. A method for manufacturing a high-frequency device, comprising:
    providing a substrate;
    forming a conductive material on the substrate;
    standing the substrate and the conductive material for a first time duration;
    forming a conductive layer by sequentially repeating the step of forming the conductive material and the step of standing at least once, wherein a thickness of the conductive layer is in a range from 0.9 μm to 10 μm; and
    patterning the conductive layer, wherein the conductive layer comprises copper;
    wherein a temperature of the substrate in the step of patterning the conductive layer is higher than a temperature of the substrate in the step of forming the conductive layer.

4. The method for manufacturing a high-frequency device as claimed in claim 3, further comprising forming a buffer layer on the substrate before the step of forming the conductive material.

* * * * *